United States Patent [19]

Stanley

[11] Patent Number: 4,681,640

[45] Date of Patent: Jul. 21, 1987

[54] LASER-INDUCED CHEMICAL VAPOR DEPOSITION OF GERMANIUM AND DOPED-GERMANIUM FILMS

[75] Inventor: Ann E. Stanley, Huntsville, Ala.

[73] Assignee: The United States of America as represented by the Secretary of the Army, Washington, D.C.

[21] Appl. No.: 893,837

[22] Filed: Aug. 6, 1986

[51] Int. Cl.$^4$ .................. H01L 21/265; B05D 3/06
[52] U.S. Cl. .................. 148/1.5; 29/576 B; 29/576 T; 148/175; 148/187; 148/DIG. 93; 148/DIG. 94; 427/53.1; 427/55; 427/86
[58] Field of Search .................. 148/1.5, 175, 187; 29/576 B, 576 T; 427/53.1, 55, 86

[56] References Cited

U.S. PATENT DOCUMENTS

| | | | |
|---|---|---|---|
| 4,340,617 | 7/1982 | Deutsch et al. | 427/53.1 |
| 4,343,829 | 8/1982 | Tochikubo et al. | 427/53.1 |
| 4,448,801 | 5/1984 | Fukuda et al. | 427/86 |
| 4,495,218 | 1/1985 | Azuma et al. | 427/53.1 |
| 4,524,090 | 6/1985 | Bottka et al. | 427/87 |
| 4,529,617 | 7/1985 | Chenevas-Paule et al. | 427/53.1 |
| 4,544,423 | 10/1985 | Tsuge et al. | 427/86 |
| 4,579,750 | 4/1986 | Bowen et al. | 427/53.1 |
| 4,581,249 | 4/1986 | Kamiya | 427/55 |
| 4,585,671 | 4/1986 | Kitagawa et al. | 427/54.1 |
| 4,608,117 | 8/1986 | Ehrlich et al. | 156/610 |

FOREIGN PATENT DOCUMENTS 0240122  11/1985  Japan ................. 427/53.1

OTHER PUBLICATIONS

Branz et al, Appl. Phys. Letts., 48 (1986), 171.
Allen et al, Jour. Appl. Phys., 58 (1985), 327.
Osmundsen et al, Jour. Appl. Phys., 57 (1985), 2921.
R. W. Andreatta, C. C. Abele. J. F. Osmundsen, J. G. Eden, D. Lubben, and J. E. Greene, Appl. Phys. Lett. 40, No. 2, 183 (182).

Primary Examiner—Upendra Roy
Attorney, Agent, or Firm—John C. Garvin, Jr.; Freddie M. Bush

[57] ABSTRACT

Germanium and doped-germanium polycrystalline films are formed using photolytic $CO_2$ laser-induced chemical vapor deposition method. Germanium being transparent to IR light makes the production of high purity polycrystalline germanium and doped-germanium films from starting compounds of germane, ethylgermane diethylgermane, and triethylgermane ideally adapted to the laser induced infrared radiation provided by the tunable, continuous-wave $CO_2$ laser which delivers infrared laser radiation in the range of 10.4 or 9.4 micrometers. Triethylgermane produces germanium in a quantity usable as a dopant. Scanning electron microscopy is used for analysis of the films. The products identified on irradiation of germane are germanium and hydrogen. Conversion rates on the order of 86% are readily obtained. On irradiation of diethylgermane and ethylgermane, ethylene, germane, germanium and hydrogen are produced. Germanium films doped with cadmium and aluminum are successfully produced by the irradiation of germane mixtures containing dimethylcadmium or trimethylaluminum, respectively. A starting material such as tetramethylgermane (TMG) which has a high vapor pressure, e.g. >70 torr and which does not have a frequency of vibration resonant with the output of the $CO_2$ laser, is usable in the presence of a sensitizer, i.e., a substance is employed with tetramethylgermane which absorbs the energy and then subsequently reacts with a transfer energy to the TMG.

12 Claims, 25 Drawing Figures

LASER-INDUCED CHEMICAL VAPOR DEPOSITION OF GERMANIUM AND DOPED-GERMANIUM FILMS

DEDICATORY CLAUSE

The invention described herein may be manufactured, used, and licensed by or for the Government for governmental purposes without the payment to me of any royalties thereon.

BACKGROUND OF THE INVENTION

Germanium and doped germanium have widespread uses in electronics, photodetectors, and optics. Some of the well established properties of germanium which are of interest to the aforementioned fields of uses are set forth below.

Germanium is a metallic element, atomic weight 72.59, atomic number 32, and a member of the carbon family. Germanium is a grayish-white metal; a semiconductor of electricity, whose conductivity depends largely on impurities present. Other properties include specific gravity of 5.323, melting point 937.4° C., boiling point 2830° C.; does not volatilize below 1350° C.; hardness 6 on Mohs scale.

Germanium is derived or recovered from residues resulting from the refinement of zinc and other sources, by heating in the presence of air and chlorine. It is also present in some coals and can be recovered from their combustion.

The purification of germanium from the aforementioned sources includes distillation of the chloride, followed by hydrolysis to the oxide, which is reduced by hydrogen to the metal. Zone-melting is used for final purification, and single semiconductor crystals are made by vaporization of germanium diiodide under conditions which cause dissociation and deposition of pure germanium.

It is the impurities in germanium which are the most important influences in its use in transistors. Therefore, after starting with the highest purity germanium the controlled introduction of trace impurities, which is termed doping, is performed to achieve the desired physical and electrical properties. Examples of doping include erbium oxide doped with thulium for use as laser crystals, germanium or silicon doped with boron or arsenic for use as semiconductors.

Because of the absolute necessity for a high purity source of germanium in its fields of uses perhaps a further review of such sources is appropriate.

Another source of the highest purity germanium is presently obtainable from the thermal decomposition of highly pure germane, $GeH_4$, under variable conditions. The major disadvantage of this thermal decomposition technique is the percent conversion which rarely exceeds 70%–80%.

The production of germanium films using an ultra violet (UV) laser has been reported by R. W. Andreatta et al, in Applied Physics Letter 40(2), 183 (1982). This technique has the distinct disadvantage that germanium is, of course, opaque to UV light, thus as deposition increases, the rate of deposition of germanium decreases.

Therefore, the primary object of this invention is to provide a laser-induced chemical vapor deposition method for germanium and doped germanium films wherein an infrared band is employed to which germanium is transparent within the wavelength and frequency employed.

A further object of this invention is to provide a laser-induced chemical vapor deposition method for germanium and doped germanium films wherein the method produces germanium in high purity by employing a $CO_2$ laser as the source of radiation for the production of polycrystalline germanium and doped germanium films.

SUMMARY OF THE INVENTION

Infrared laser-induced production of polycrystalline germanium and doped-germanium films is achieved by irradiating compounds selected from germane, ethylgermane diethylgermane, triethylgermane, and tetraethylgermane in the gas phase with infrared laser radiation in the range of 10.4 or 9.4 micrometers provided by a continuous-wave $CO_2$ laser. Dimethylcadmium or trimethylaluminum is included as a second compound where a codeposite is required for the doped-germanium film.

The gas phase irradiations are carried out in stainless steel cells (5×10 cm) equipped with O-ring seals for securing windows (5 cm diameter) onto the cells. The infrared laser beam entered through ZnSe windows at either end of the cell (traversing a 10 cm path). Potassium chloride windows are used on the short pathlength (5 cm) for recording the infrared spectra. To view UV-visible emission, the KCl windows are replaced with $2'' \times \frac{1}{4}''$ quartz windows and the emission observed using a Jarrell Ash Czerny-Turner scanning spectrometer and Polaroid Land Film.

Sample pressures from about 3.0 to 220 Torr are used. Irradiation is at room temperature, and at frequencies selected by viewing the infrared spectrum of each compound relative to available output frequencies and intensities.

Infrared laser radiation in the range of 10.4 or 9.4 micrometers is provided by a Coherent Radiation Laboratories model 41 continuous-wave $CO_2$ laser. The exact laser frequencies are verified using an Optical Engineering $CO_2$ spectrum analyzer. In single-line operation, output powers between 10 and 150 W/cm$^2$ is obtained by variation of the $CO_2$—$N_2$—He gas mixture in the laser. The beam size is measured from burn patterns and is found to be approximately circular with a 4 mm diameter. The ZnSe window on the sample cell is found to transmit only 64% of the incident infrared radiation, so a measure of the laser power available to the samples must be adjusted accordingly.

The production of pure germanium and doped-germanium polycrystalline films in accordance with the infrared laser-induced method of this invention are summarized in the following reactions:

1. $GeH_4 \rightarrow Ge + H_2$
2. $(CH_3CH_2-)_{4-n}GeH_n \rightarrow Ge +$ gaseous products where n=1 to 3
3. $GeH_4 + (CH_3)_2Cd \rightarrow Ge + Cd +$ gaseous products
4. $GeH_4 + (CH_3)_3Al \rightarrow Ge + Al +$ gaseous products

DESCRIPTION OF THE PREFERRED EMBODIMENT

Figure 1:
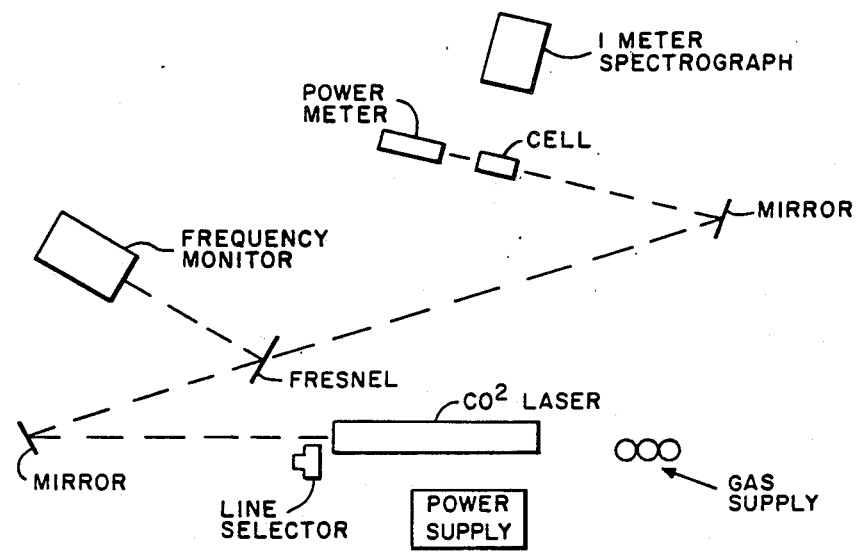
FIG. 1 depicts a typical setup for infrared laser induced experiments.

Laser-induced chemical vapor deposition of germanium and doped germanium as provided by the procedures of this invention yield polycrystalline germanium and doped-germanium films.

Germanium and doped-germanium polycrystalline films are formed with the use of photolytic $CO_2$ laser-induced chemical vapor deposition. The compounds which yielded germanium in large quantities are germane, ethylgermane, and diethylgermane. Triethylgermane produces germanium in trace quantities. Gas-phase reactions are monitored with the use of Fourier transform infrared spectroscopy, also used for identification of end products. Scanning electron microscopy is used for analysis of the films. The products identified on irradiation of germane are germanium and hydrogen, with conversion rates of 86%. On irradiation of diethylgermane and ethylgermane, ethylene, germane, germanium, and hydrogen are produced. Germanium films doped with cadminum and aluminum are produced successfully by the irradiation of germane mixtures containing dimethylcadmium or trimethylaluminum, respectively.

EXPERIMENTAL

High-purity starting materials were obtained from commercial sources. Purity was monitored by comparison to published spectra. The germane was obtained commercially from Matheson Gas Products. Its purity was monitored by comparison of its gas-phase infrared spectrum with known spectra. The dimethylcadmium was obtained commercially from Alfa Products (Morton Thickol, Inc.). Its gas-phase infrared spectrum was compared with its literature spectra. The trimethylaluminum was obtained from Pfaltz-Bauer. Its gas-phase infrared spectrum was monitored by comparision with literature spectra.

The gas phase irradiations were carried out in stainless steel cells (5×10 cm) equipped with O-ring seals for securing windows (5 cm diameter) onto the cells. The infrared laser beam entered through ZnSe windows at either end of the cell (traversing a 10 cm path). Potassium chloride windows were used on the short path-length (5 cm) for recording the infrared spectra. To view UV-visible emission, the KCl windows were replaced with $2'' \times \frac{1}{4}''$ quartz windows and the emission observed using a Jarrell Ash Czerny-Turner scanning spectrometer and Polaroid Land Film.

Infrared laser radiation in the range of 10.4 or 9.4 micrometers is provided by a continuous-wave $CO_2$ laser, such as the Coherent Radiation Laboratories model 41. The exact laser frequencies are verified using an Optical Engineering $CO_2$ spectrum analyzer. In single-line operation, output powers between 10 and 150 $W/cm^2$ is obtained by variation of the $CO_2$—$N_2$—He gas mixture in the laser. The beam size is measured from burn patterns and is found to be approximately circular with a 4 mm diameter. The ZnSe window on the sample cell is found to transmit only 64% of the incident infrared radiation, so a measure of the laser power available to the samples must be adjusted accordingly.

Infrared spectra is recorded on a Mattson model Sirius 100 interferometer equipped with a water-cooled carborundum source, iris aperture, KBr beamsplitter, and TGS detector. Interferograms are transformed after applying a triangular apodization function with an effective spectral resolution of 1.0 $cm^{-1}$. This resolution is sufficient to allow unequivocal identification of all the produces as well as to monitor the decrease of the starting material from its infrared absorption bands.

The polycrystalline films are analyzed on a Cambridge F-150 scanning electron microscope used in the x-ray mode.

Because of the range of frequencies, 908-1092 $cm^{-1}$, attainable by the CW $CO_2$ laser several viable candidates for investigation of the production of germanium using laser photochemistry are preferred. Not only germane, $GeH_4$, with an infrared absorption at 931 $cm^{-1}$, as noted from J. of Mol. Spectrosc., 44, 425(1972) and Spectrochim Acta. 234, 777 (1967) [1, 2*], but also the alkyl substituted germanes, with appropriate selection of the alkyl group are preferred. With an alkyl substituent such as ethyl, for one example, with either the C—C stretching frequency of the methyl rocking frequency accessible by the $CO_2$ laser, the organogermanes are good potential starting materials.

*Reference to Table 9: "Frequencies and Assignments for the Infrared Bands Observed in Thermal and Laser Photochemical Dissociations".

SPECIFIC EXAMPLES

IRRADIATIONS OF GERMANE AND ALKYLGERMANES

In further reference to FIG. 1, one or more cells (as $ illustrated) can be provided and adapted for receiving prepared substrates on to which deposition of polycrystalline germanium or doped-germanium films is made thereby permitting loading and unloading for batch irradiations. Further, for continuous irradiations a mobile system could be provided to enable the proper time of exposure to achieve the desired results.

Figure 2A:
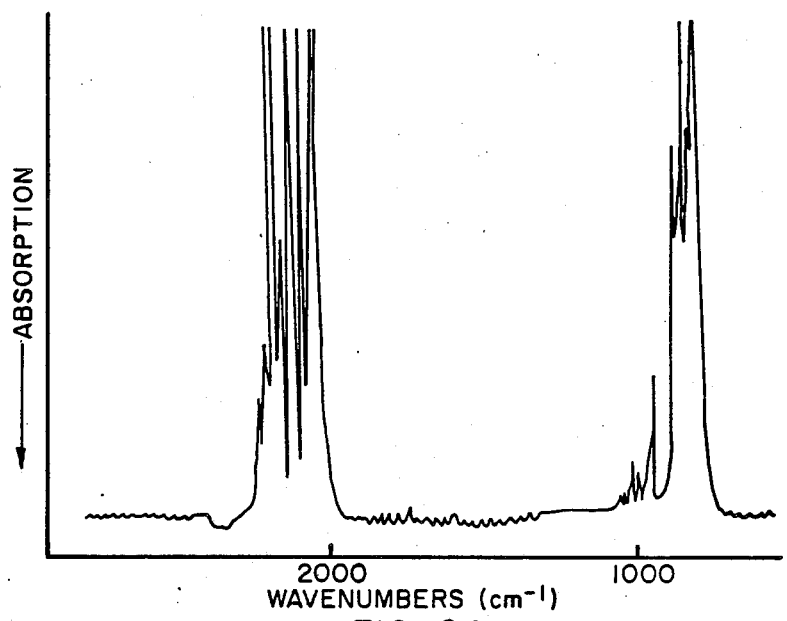
FIGS. 2A-2B depict infrared spectra of germane before and after infrared laser irradiation, respectively.
Figure 2B:
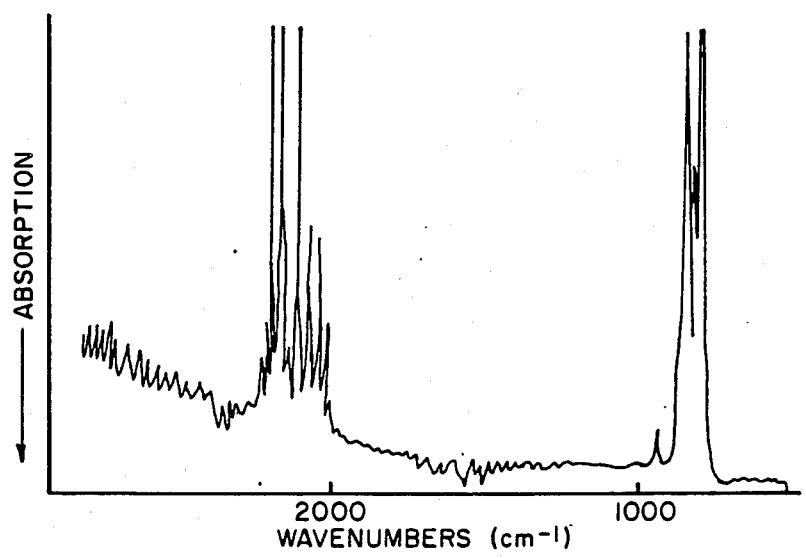

In further reference to the drawing, FIG. 2A and FIG. 2B, respectively, depict the infrared spectra of 200 torr of germane, before and irradiation for 1 minute at P(30) of (00°1)-(10°0), 935 $cm^{-1}$. Reactions are accompanied by a reddish glow. Attempts, using a Czerny-Turner scanning spectrometer, to record the emmission spectra produced during irradiations were unsuccessful.

However, this glow could be emission from excited germyl or hydrogen radicals. The identity of the germanium films is verified using analysis by a scanning electron microscope operating in the x-ray mode. These results are found in Table 1. The second sample, with calcium and silicon showing up as impurities, was disturbed during sample handling with resultant loss of some of the Ge deposit. The Ca and Si is likely from the quartz slide which served as a substrate. Repeated irradiations with percent conversions of 86% are possible.

TABLE 1

| Analysis of Germanium Films.[a] | |
|---|---|
| Origin | Analysis |
| $GeH_4$ | 100% Ge |
| $GeH_4$ | Ge, Si, Ca[b] |
| $(CH_3CH_2)_2GeH_2$ | 100% Ge |
| $(CH_3)_2Cd + GeH_4$ | 73% Ge, 27% Cd |
| $(CH_3)_3Al + GeH_4$ | 87% Ge, 13% Al |

[a]Analysis by electron scanning microscope in the x-ray mode.
[b]Very thin deposition of Ge, apparently the quartz slide is influencing results.

Figure 3A:
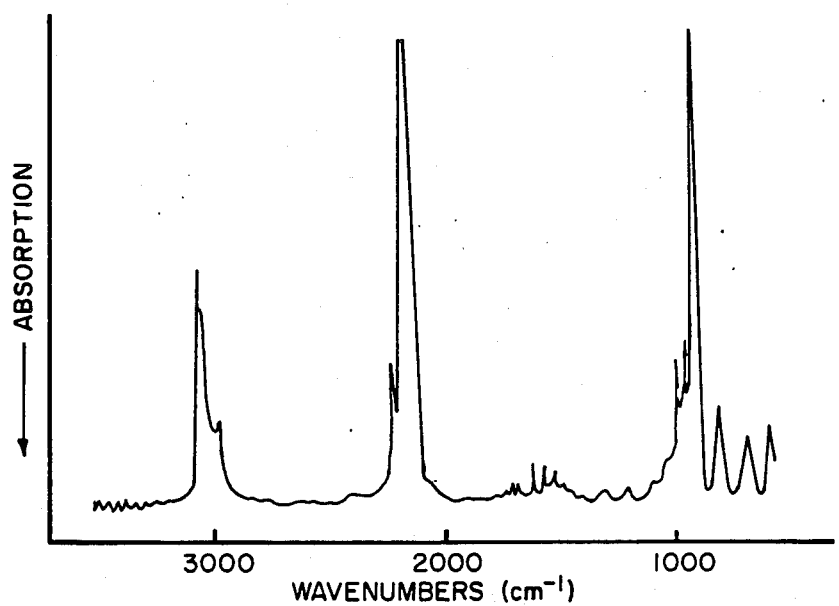
FIGS. 3A-3B depict infrared spectra of ethylgermane before and after infrared laser irradiation respectively.
Figure 3B:
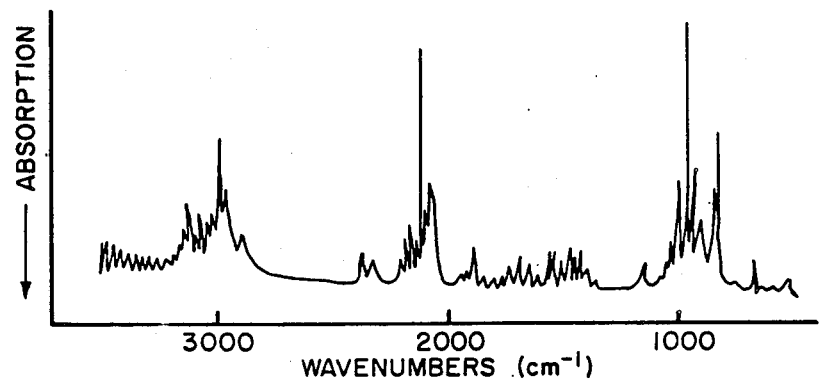

The laser photochemical dissociation of ethylgermane is presented in the infrared spectra of FIGS. 3A and 3B. There is a minor impurity of the spectra of ethylgermane, however, this impurity was also observed in the vibrational studies of this molecule [6, 7] (See Table 9). Also present in the spectra, FIGS. 3A and 3B, are bands from diethyl ether, the solvent in the reduction of the chloroorganogermanes to organogermanes. Efforts to completely remove the ether using distillation and trap to trap purification techniques failed. It is quite clear in the infrared spectrum, FIG. 6B that the bands due to diethyl ether are completely unaffected by the irradiation of ethylgermane. An 80 torr sample of ethylgermane was irradiated at 100 W/cm² for 30 seconds, at R(26) of (00°1)–(10°0), 980 cm⁻¹. The frequencies of infrared bands and identity of materials found in the infrared spectra of ethylgermane are summarized in Table 2. Readily identified were methane, ethylene and germane. Also produced was a black deposit of germanium and hydrogen. Note that in FIG. 3B the infrared spectrum shows that no bands due to ethylgermane remain, indicative that the ethyl germane was totally destroyed.

The references set forth in Tables 2–7 and elsewhere in the specification are fully identified in Table 9: "Frequencies and Assignments for the Infrared Bands Observed in Thermal and Laser Photochemical Dissociations".

TABLE 2

Frequencies (cm⁻¹)[a] and Assignments for the Infrared Bands Observed in the Laser Photochemical Dissociation of Ethylgermane, $CH_3CH_2GeH_3$.

| Ethylgermane | After Irradiation[b] | Identity | Reference |
|---|---|---|---|
|  | 3135 | ethylene | 8 |
|  | 3020 |  |  |
|  | 3010 | methane | 8 |
|  | 2988 | solvent[c] |  |
| 2971 |  | ethylgermane (EG) | 6, 7 |
| 2965 |  | EG | 6, 7 |
| 2885 |  | EG | 6, 7 |
|  | 2880 | solvent |  |
| 2144 |  | impurity |  |
|  | 2110 | germane | 1, 2 |
| 2079 |  | EG | 6, 7 |
| 1460 | 1460 |  |  |
|  | 1420 |  |  |
| 1400 |  |  |  |
| 1260 |  |  |  |

TABLE 2-continued

Frequencies (cm⁻¹)[a] and Assignments for the Infrared Bands Observed in the Laser Photochemical Dissociation of Ethylgermane, $CH_3CH_2GeH_3$.

| Ethylgermane | After Irradiation[b] | Identity | Reference |
|---|---|---|---|
| 1250 |  |  |  |
| 1140 |  | solvent |  |
| 1030 |  | EG | 6, 7 |
| 965 |  | EG | 6, 7 |
|  | 949 | ethylene | 8 |
| 884 |  | EG | 6, 7 |
|  | 846 |  |  |
| 834 |  | EG | 6, 7 |
|  | 825 | germane | 1, 2 |
| 739 |  | EG | 6, 7 |
| 619 |  | EG | 6, 7 |
| 523 |  | EG | 6, 7 |

[a]Only the major bands of compounds are indicated.
[b]At 100 W/cm², 30 second, R(26) of (00°1)-(10°0), 980 cm⁻¹.
[c]Solvent = diethyl ether.

Figure 4A:
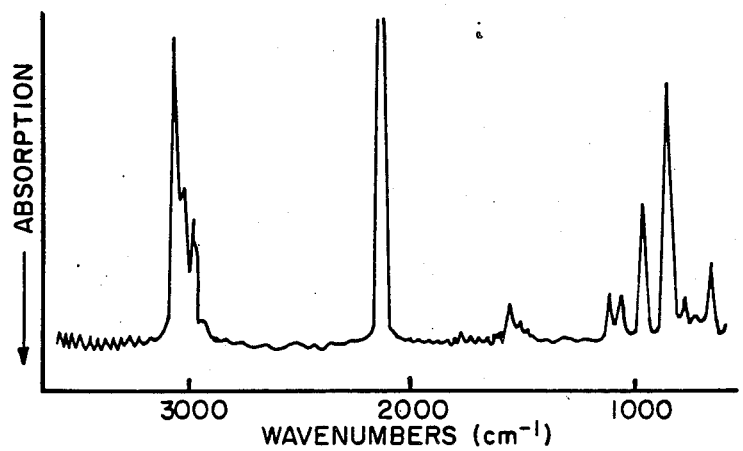
FIGS. 4A-4C depict infrared spectra of diethylgermane before and after infrared laser irradiation and after repeat irradiation respectively.
Figure 4B:
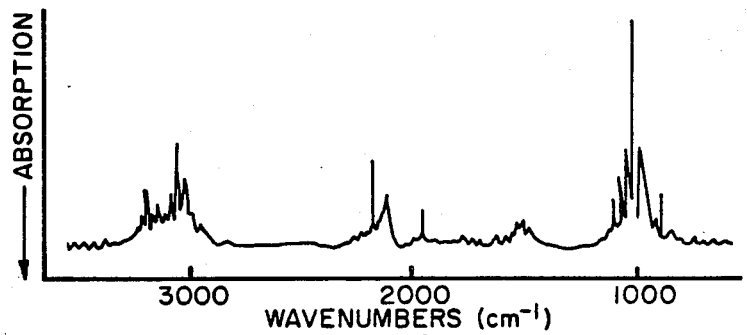
Figure 4C:
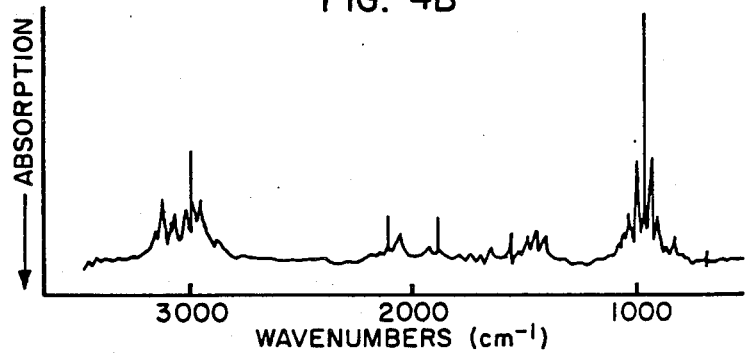
Figure 5A:
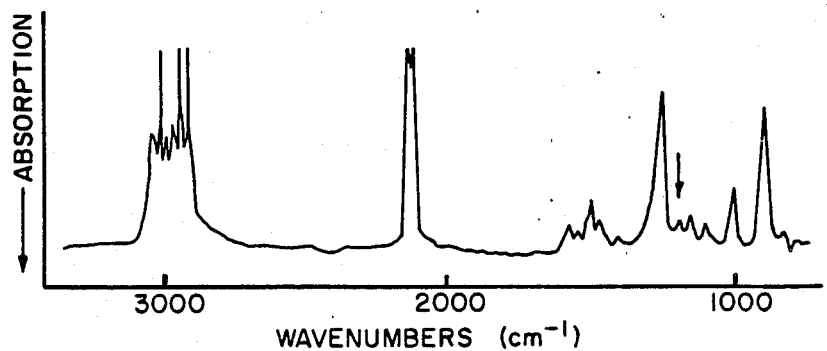
FIGS. 5A-5D depict infrared spectra of diethylgermane in diethyl ether before and after a repeat irradiation respectively.
Figure 5B:
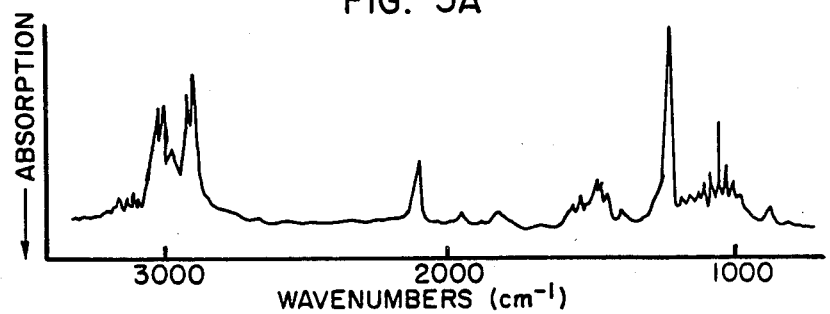
Figure 5C:
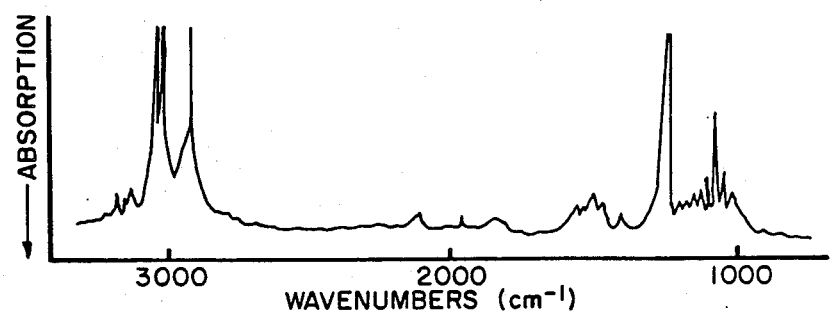
Figure 5D:
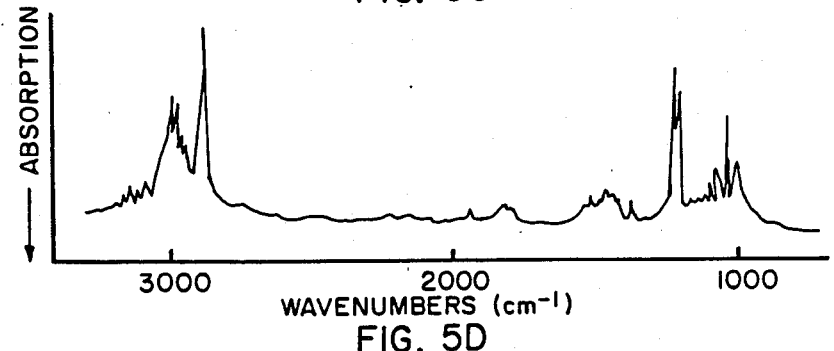

Attempts to produce germanium from diethylgermane were successful. Infrared spectra representing the experiments performed with diethylgermane are presented in FIGS. 4A–4C and 5A–5D respectively. As shown in the infrared spectra in FIG. 4A, 40 torr of diethylgermane was irradiated at R(14) of (00°1)–(10°0), 1075 cm⁻¹, for 15 seconds, 100 W/cm². This irradiation was then repeated for an additional 30 seconds. It is particularly noticeable in the spectra in FIGS. 4B and 4C that the diethylgermane bands are disappearing. The Ge—H stretching at 2051 cm¹ is virtually gone as are the Ge—C stretching fundamentals below 900 cm⁻¹. The infrared frequencies used to identify the components of the mixtures are summarized in Table 3. Ethylene and germane are identifiable from the spectra. Also produced is a deposit of elemental germanium and hydrogen gas. Analysis of the germanium sample by scanning electron microscopy operating in the x-ray mode is shown in Table 1. A second series of experiments were performed using a mixture of diethylgermane and residual diethyl ether left from the reduction reaction. In these experiments, irradiations were performed using 130 torr of a mixture of diethylgermane and diethyl ether. The laser line selected was P(34) of (00°1)–(10°0), 931 cm⁻¹. Three successive irradiations were performed using 35 W/cm² for 30 seconds, then 65 W/cm² for 30 seconds, and finally 50 W/cm² for another 30 seconds. The results of these irradiations are depicted in the infrared spectra shown in FIGS. 5A, 5B, 5C and 5D. These irradiation conditions are at the frequency of a diethyl ether fundamental. In this case, the diethyl ether dissociated producing ethylene, methane, carbon monoxide and acetaldehyde. Additionally, enough energy was transferred to the diethylgermane through collisions to dissociate that molecule producing ethylene, germane, germanium and hydrogen. The infrared frequencies used to identify some of these materials are summarized in Table 3.

TABLE 3

Frequencies (cm⁻¹)[a] and Assignments for the Infrared Bands Observed in the Laser Photochemical Dissociation of Diethylgermane, $(CH_3CH_2)_2GeH_2$

| Diethylgermane (DEG) | After Irradiation[b] | | Identity | Reference |
|---|---|---|---|---|
|  | 972 cm⁻¹ | 931 cm⁻¹ |  |  |
|  | 3135 | 3135 | ethylene | 8 |
|  | 3005 | 3004 | methane | 8 |
|  |  | 2987 | solvent[c] | 9 |
|  | 2976 |  |  |  |
|  | 2968 |  | solvent | 9 |

TABLE 3-continued

Frequencies (cm$^{-1}$)[a] and Assignments for the Infrared Bands Observed in the Laser Photochemical Dissociation of Diethylgermane, (CH$_3$CH$_2$)$_2$GeH$_2$

| Diethylgermane (DEG) | After Irradiation[b] 972 cm$^{-1}$ | 931 cm$^{-1}$ | Identity | Reference |
|---|---|---|---|---|
| 2958 | 2958 | | DEG | |
| 2954 | 2953 | | DEG | |
| | | 2883 | 2882 | DEG |
| | | 2871 | solvent | 9 |
| | | 2143 (ctr) | CO | 10 |
| | 2110 | 2110 | germane | 1, 2 |
| 2051 | 2051 | 2050 | DEG | |
| 2038 | | | DEG | |
| | | 1985 | solvent | 9 |
| | 1888 | 1889 | ethylene | 8 |
| | | 1737 | acetaldehyde | 11 |
| 1465 | | | | |
| | | 1443 | solvent | 9 |
| 1392 | | 1393 | solvent | 9 |
| 1383 | | 1384 | solvent | 9 |
| 1360 | | 1360 | solvent | 9 |
| | | 1306 | solvent | 9 |
| | | 1142 | solvent | 9 |
| 1132 | | 1132 | solvent | 9 |
| 1073 | 1072 | 1072 | solvent | 9 |
| 1023 | | | DEG | |
| | | 1006 | | |
| 969 | | | DEG | |
| | 949 | 949 | ethylene | 8 |
| | 929 | | germane | 1, 2 |
| | | 890 | | |
| 876 | | | DEG | |
| 767 | | 770 | solvent | 9 |
| 688 | | | DEG | |
| 635 | | | DEG | |
| 575 | | | DEG | |

[a]Only the major bands of compounds are indicated.
[b]At 100 W/cm$^1$, 30 seconds R(14) of (00°1)-(10°0), 972 cm$^{-1}$, or 100 W/cm$^2$, 1 minute, P(34) of (00°1)-(10°0), 931 cm$^{-1}$.
[c]Solvent = diethyl ether.

Figure 6:
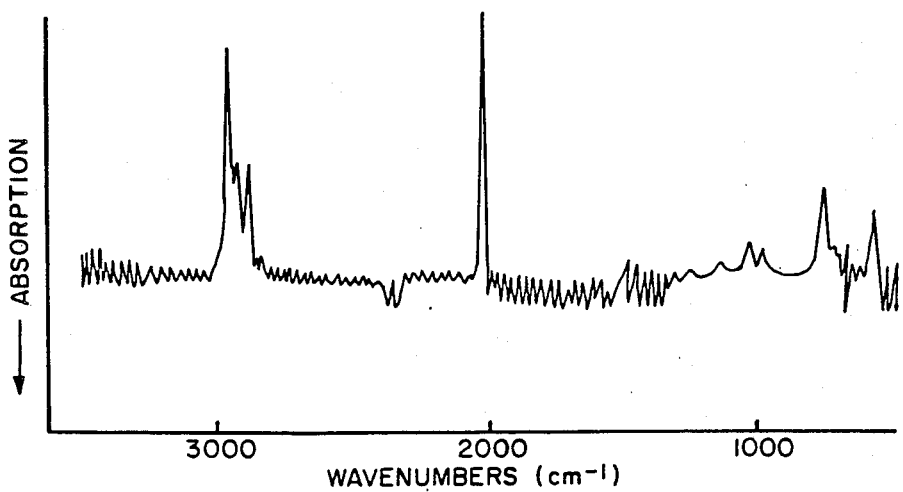
FIG. 6 depicts an infrared spectrum of triethylgermane.
Figure 7A:
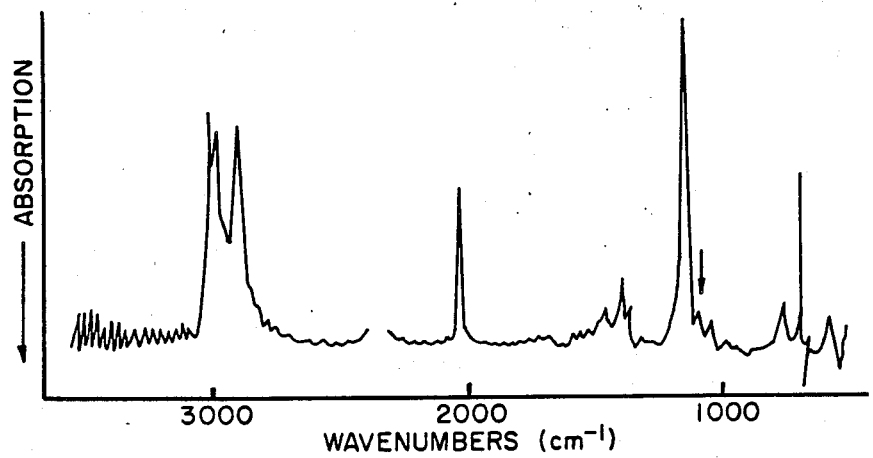
FIGS. 7A-7B depict infrared spectra of triethylgermane in diethyl ether before and after infrared laser irradiation respectively.
Figure 7B:
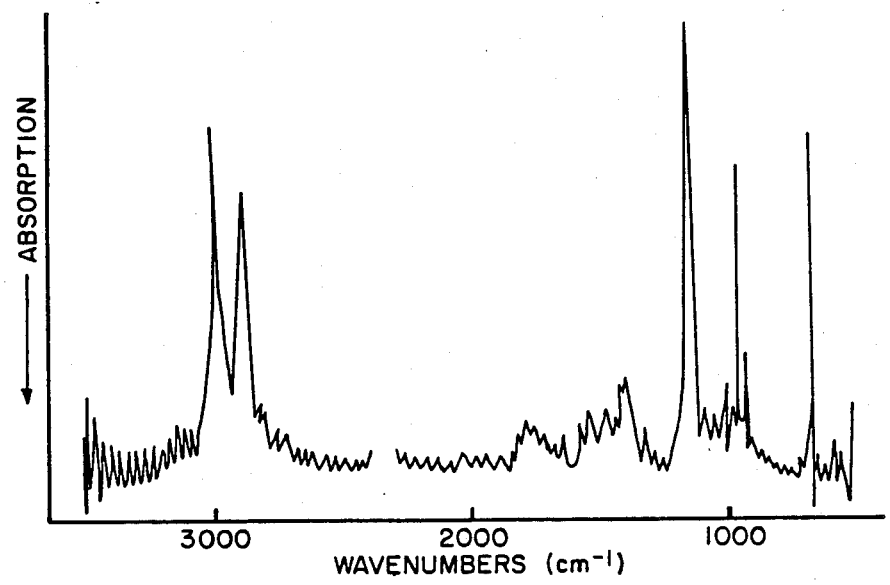

Triethylgermane has the lowest vapor pressure, 3.5 torr, of the three ethylgermane compounds studied. On irradiation of a maximum vapor pressure sample for 15 seconds at R(14) of (00°1)-(02°0), 1075 cm$^{-1}$, 100 W/cm$^2$, very slight decomposition did occur with a "barely visible" deposition of germanium. Also produced were germane, ethylene and hydrogen. Shown in FIG. 6 is an infrared spectrum of triethylgermane. A second series of experiments involved the irradiation of a mixture of triethylgermane and residual solvent, diethyl ether. An irradiation identical to that used on the pure compound was performed. These experiments are represented in the infrared spectra shown in FIGS. 7A and 7B. The triethylgermane is destroyed, note the virtual disappearance of the Ge—H stretching band at 2018 cm$^{-1}$ and the Ge—C stretching bands at 576 and 568 cm$^1$. Despite destruction of the molecule, only a small deposit of germanium was obtained. Also produced was ethylene, methane and hydrogen. The infrared frequencies used to identify the species are summarized in Table 4.

TABLE 4

Frequencies (cm$^{-1}$)[a] and Assignments for the Infrared Bands Observed in the Laser Photochemical Dissociation of Triethylgermane, (CH$_3$CH$_2$)$_3$GeH

| Triethylgermane (REG) | Mixture | After Irradiation[b] 1075 cm$^{-1}$ | Identity | Reference |
|---|---|---|---|---|
| | | 3135 | ethylene | 8 |
| | | 3004 | methane | 8 |
| | 2989 | 2989 | solvent[c] | 9 |
| | 2965 | 2965 | solvent | 9 |
| 2962 | 2960 | 2960 | TEG | |
| 2922 | | | TEG | |
| 2882 | | | TEG | |
| | 2876 | 2876 | solvent | 9 |
| 2015 | 2018 | 2017 | TEG | |
| | | | acetaldehyde | 11 |
| | 1394 | 1394 | solvent | 9 |
| | 1388 | 1388 | solvent | 9 |
| | | 1363 | solvent | 9 |
| 1240 | | | TEG | |
| 1172 | | | TEG | |
| | 1140 | 1140 | solvent | 9 |
| 1137 | | | TEG | |
| | 1075 | 1075 | solvent | 9 |
| 1020 | 1020 | | TEG | |
| 970 | 970 | | TEG | |
| | | 949 | ethylene | 8 |
| 754 | 755 | | TEG | |
| 706 | | | TEG | |
| 576 | 576 | | TEG | |
| 568 | 568 | | TEG | |

[a]Only the major bands of compounds are indicated.
[b]At 100 W/cm$^2$, 15 seconds, R(14) of (00°1)-(02°0), 1075 cm$^{-1}$.
[c]Solvent = diethyl ether.

Figure 8A:
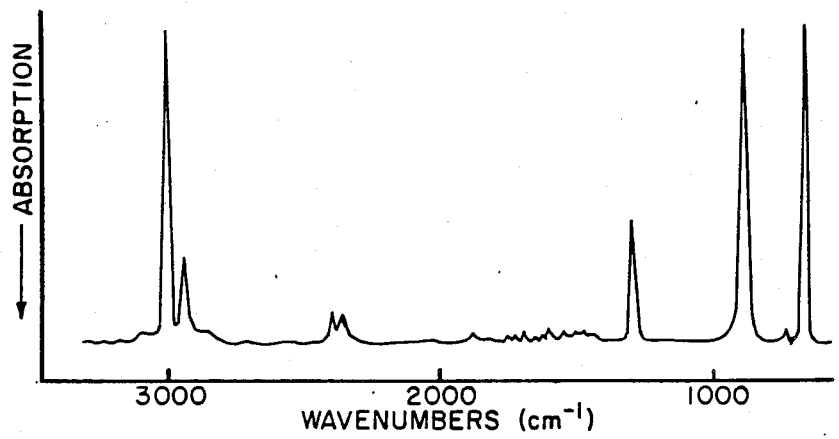
FIGS. 8A-8C depict infrared spectra of tetramethylgermane, tetramethylgermane in NOCl, and tetramethylgermane in NOCl after irradiation respectively.
Figure 8B:
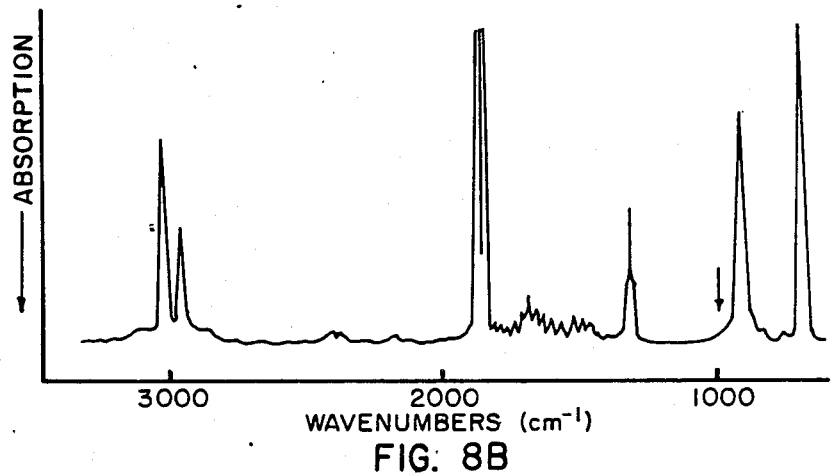
Figure 8C:
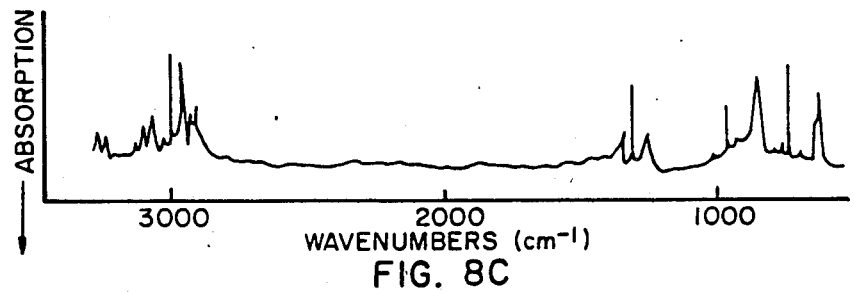

Tetramethylgermane has a high vapor pressure, >70 torr. Thus it has great potential for production of germanium using laser photochemistry. However, tetramethylgermane has no frequency of vibration resonant with the output of the CO$_2$ laser. One alternative which exists when compounds do not possess vibrational modes with frequencies accessible by the CO$_2$ laser is to use a substance which can absorb energy itself, then react with or transfer energy to the compound of interest, i.e., function of sensitizer. Three materials were selected as potential sensitizers: trichloroethane, trichloroethylene and NOCl. In the first two cases, the only dissociation occurred in the absorbing molecules, insufficient energy transfer occurred to cause dissociation in tetramethylgermane. In the case of NOCl, reaction did occur as depicted in FIGS. 8B and 8C. A mixture of 70 torr of tetramethylgermane and 70 torr of NOCl was irradiated at P(34) of (00°1)-(10°0), 931 cm$^1$, 30 seconds at 75 W/cm$^2$. Products identified from the spectra include ethylene, methane and acetylene. The infrared frequencies used for the identification of products are summarized in Table 5. In addition to these products, a brownish deposit of impure germanium was formed. The impurity was characterized by a broad infrared absorption band at 1000 cm$^{-1}$.

TABLE 5

Frequencies (cm$^{-1}$)[a] and Assignments for the Infrared Bands Observed in the Laser Photochemical Reaction of Tetramethylgermane, (CH$_3$)$_4$Ge and NOCl.

| Tetramethylgermane (TMG) | Mixture | After Irradiation[b] at 931 cm$^{-1}$ | Identity | Reference |
|---|---|---|---|---|
| | | 3135 | ethylene | 8 |
| | | 3010 | methane | 8 |
| 2987 | 2987 | 2989 | TMG | 12 |
| 2987 | 2979 | 2979 | TMG | 12 |
| 2915 | 2910 | 2916 | TMG | 12 |
| 2880 | 2882 | | TMG | 12 |
| 2340 | | | TMG | 12 |
| | 1790 | 1791 | NOCl | |
| | 1600 | 1600 | NOCl | |
| 1559 | | | TMG | 12 |
| | | 1306 | methane | 8 |
| 1244 | 1244 | 1245 | TMG | 12 |

TABLE 5-continued

Frequencies (cm$^{-1}$)[a] and Assignments for the Infrared
Bands Observed in the Laser Photochemical
Reaction of Tetramethylgermane, (CH$_3$)$_4$Ge and NOCl.

| Tetramethylgermane (TMG) | Mixture | After Irradiation[b] at 931 cm$^{-1}$ | Identity | Reference |
|---|---|---|---|---|
| | | 949 | ethylene | 8 |
| 834 | 828 | 828 | TMG | 12 |
| | | 729 | acetyene | 8 |
| | | 713 | | |
| 602 | 600 | 602 | TMG | 12 |

[a]Only the major bands of compounds are indicated.
[b]At 100 W/cm$^2$, 30 seconds, R(14) of (00°1)-(10°0), 931 cm$^{-1}$.
[c]Codeposition.

Figure 9A:
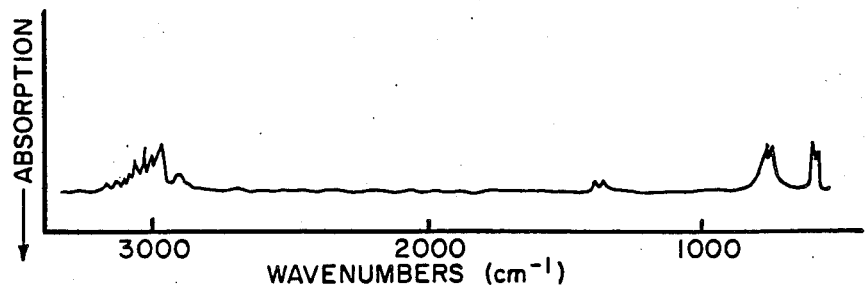
FIGS. 9A-9C depict infrared spectra of dimethylcadmium, dimethylcadmium and germane, and dimethylcadmium and germane after infrared laser irradiation respectively.
Figure 9B:
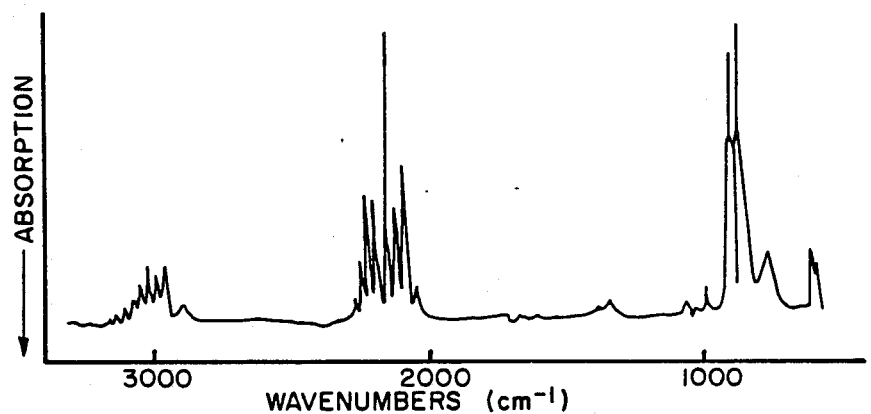
Figure 9C:
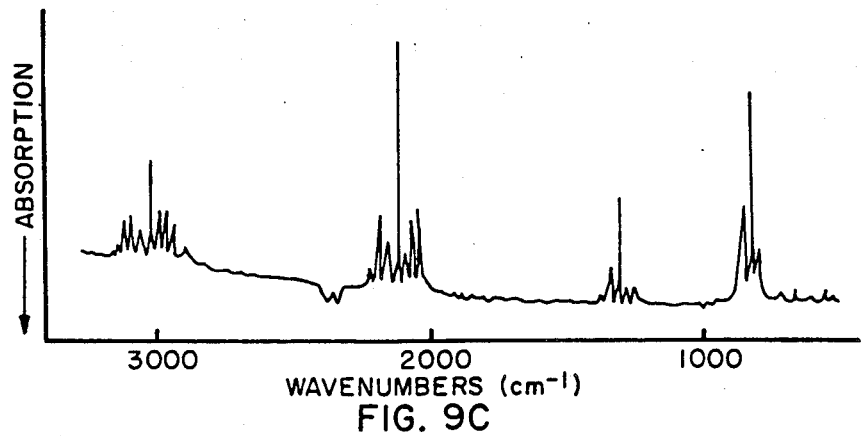

In the use of germanium as an extrinsic infrared detector, highly pure germanium is doped with other elements, thus changing its wavelength sensitivity. The ability to codeposit substances such as cadmium and aluminum with germanium is an important technique. As represented in the infrared spectra found in FIGS. 9A–9C, a 25 torr sample of dimethylcadmium was mixed with 75 torr of germane. This mixture was then irradiated at P(26) of (00°1)-(10°0), 939 cm$^{-1}$, for 30 seconds, 100 W/cm$^2$. The product identifiable from the infrared spectrum shown in FIG. 9C is methane. Note that in the infrared spectrum shown in FIG. 9C, the infrared bands due to dimethylcadmium are completely gone. The infrared frequencies used to identify the products formed in this reaction are summarized in Table 6. Also produced in this reaction are cadmium, germanium and hydrogen. The analysis of the deposited film by scanning electron microscopy is given in Table 1.

TABLE 6

Frequencies (cm$^{-1}$)[a] and Assignments for the Infrared
Bands Observed in the Laser Photochemical Reaction
of Germane and Dimethyl Cadmium.

| Dimethyl Cadmium (DMC) | Mixture | After Irradiation[b] 931 cm$^{-1}$ | Identity | Reference |
|---|---|---|---|---|
| 3018 | 3018 | 3018 | methane | 8 |
| 2978 | 2978 | | DMC | 3, 4 |
| 2932 | 2932 | | DMC | 3, 4 |
| 2915 | 2915 | | DMC | 3, 4 |
| 2860 | 2860 | | DMC | 3, 4 |
| 2290 | | | DMC | 3, 4 |
| | 2105 | 2105 | germane | 1, 2 |
| 1318 | 1318 | | DMC | 3, 4 |
| 1304 | 1304 | 1304 | methane | 8 |
| | 935 | | germane | 1, 2 |
| | 816 | 816 | germane | 1, 2 |
| 702 | 702 | 702 | DMC | 3, 4 |
| 657 | 657 | 657 | DMC | 3, 4 |

[a]Only the major bands of compounds are indicated.
[b]At 100 W/cm$^2$, 30 seconds, R(14) of (00°1)-(10°0), 931 cm$^{-1}$.

Figure 10A:
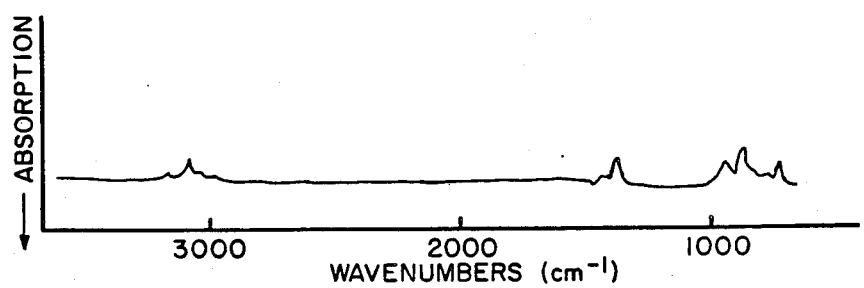
FIGS. 10A-10D depict infrared spectra of trimethylaluminum, trimethylaluminum and germane, trimethylaluminum and germane after infrared laser irradiation, and trimethylaluminum and germane after a repeat irradiation respectively.
Figure 10B:
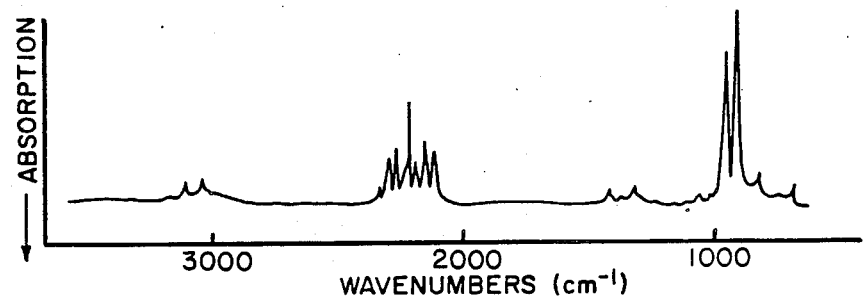
Figure 10C:
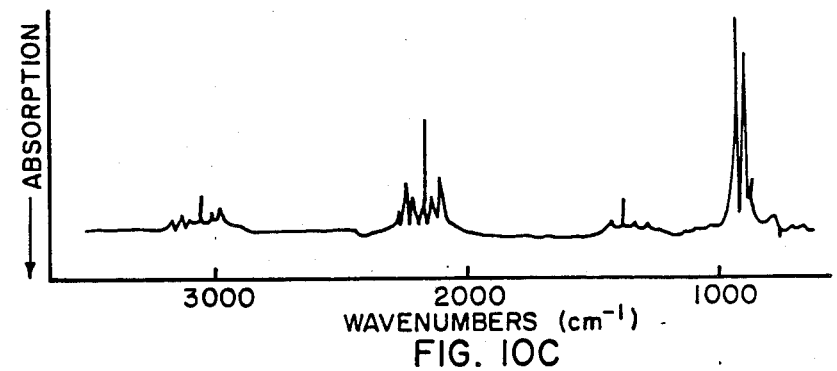
Figure 10D:
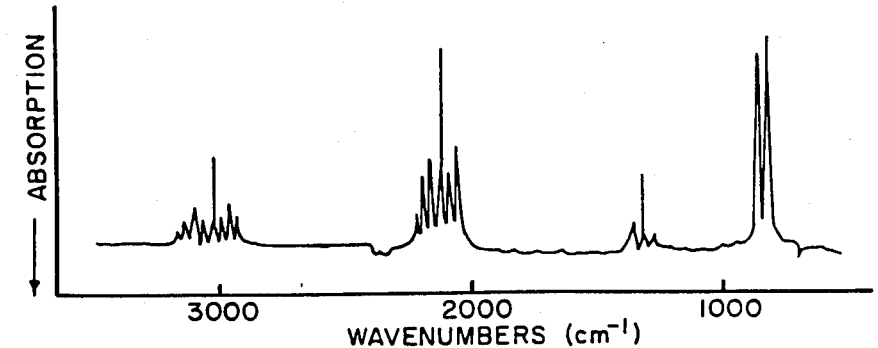

A second series of experiments were performed using trimethylaluminum and germane. As illustrated in the infrared spectra of FIGS. 10A–10D, 12.5 torr of trimethylaluminum was mixed with 112 torr of germane. This mixture was then irradiated using P(26) of (00°1)-(10°0), 939 cm$^{-1}$, for 30 seconds, 100 W/cm$^2$. It is apparent in the spectrum shown in FIG. 10C that the infrared bands of germane and trimethylaluminum are decreasing in intensity. In the infrared spectrum shown in FIG. 10D, after an identical irradiation, the trimethylaluminum bands have disappeared, indicating the complete destruction of trimethylaluminum. The only product identifiable from the spectra is methane. The infrared frequencies used for identification of products is summarized in Table 7. The scanning electron microscopic analysis of the film is shown in Table 1. The products, then, are methane, germanium, aluminum and hydrogen.

TABLE 7

Frequencies (cm$^{-1}$)[a] and Assignments for the Infrared
Bands Observed in the Laser Photochemical Reaction
of Germane and Trimethyl Aluminum.

| Trimethyl Aluminum (TMA) | Mixture | After Irradiation[b] 931 cm$^{-1}$ | Identity | Reference |
|---|---|---|---|---|
| 3018 | 3018 | 3918 | methane | 8 |
| 2940 | 2940 | | TMA | 5 |
| 2895 | 2900 | | TMA | 5 |
| 2840 | 2838 | | TMA | 5 |
| | 2107 | 2107 | germane | 1, 4 |
| 1340 | 1310 | 1311 | methane | 8 |
| 1252 | 1253 | | TMA | 5 |
| 1206 | 1210 | | TMA | 5 |
| 1170 | 1164 | | TMA | 5 |
| | 935 | 935 | germane | 1, 2 |
| | 818 | 816 | germane | 1, 2 |
| 776 | | | | |
| 700 | 700 | 700 | TMA | 5 |
| 650 | 650 | | TMA | 5 |
| 605 | 610 | | TMA | 5 |

[a]Only the major bands of compounds are indicated.
[b]At 100 W/cm$^2$, 30 seconds, R(14) of (00°1)-(10°0), 931 cm$^{-1}$.

Those compounds which have been shown to be good candidates for production of germanium using the laser are germane, ethylgermane and diethylgermane. The products of several of the laser photochemical reactions including tetramethylgermane, ethylgermane, diethylgermane, triethylgermane are summarized in Table 8. Obviously, the easiest separation is produced by the decomposition of germane. Hydrogen can be pumped away leaving a pure germanium deposit. However, in thermal processes, percent conversions of the 70 to 80% are rarely exceeded. In the experiments performed in this study with germane, conversions of 86% were obtained without difficulty. Further investigations of the laser photochemical decomposition of germane and alkylgermanes have shown that greater conversion rates can be obtained by process optimization and by use of SF$_6$ as a

TABLE 8

A Summary of Reaction Products

| Starting Substances | Irradiation Frequency, cm$^{-1}$ | Products of Irradiation |
|---|---|---|
| Tetramethylgermane + NOCl | 931 | methane ethylene acetylene CO, CO$_2$ NO$_2$ Ge, impure |
| Ethylgermane | 980 | ethylene Ge, H$_2$ |
| Diethylgermane | 1075 | ethylene methane germane Ge, H$_2$ |
| Germane | 935 | Ge, H$_2$ |
| Germane + Dimethylcadmium | 931 | methane Ge, Cd H$_2$ |
| Germane + Trimethylalumium | 931 | methane Ge, Al H$_2$ |

The results of this investigation can be summarized in the following reactions:

1. GeH$_4 \rightarrow$ Ge + H$_2$
2. (CH$_3$CH$_2-$)$_{4-n}$GeH$_n \rightarrow$ Ge + gaseous products where n = 1 to 3
3. GeH$_4$ + (CH$_3$)$_2$Cd $\rightarrow$ Ge + Cd + gaseous products TABLE 8-continued A Summary of Reaction Products 4. $GeH_4 + (CH_3)_3Al \rightarrow Ge + Al +$ gaseous products Conclusions and Further Considerations The chlorogermanes provided to be poor starting materials for the production of elemental germanium. This was due is large part to the low vapor pressure of the chloro-ethylgermanes. The methyl substituted compounds are better candidates from consideration of vapor pressures. However, the methyl substituents do not have frequencies resonant with the output of the $CO_2$ laser. The use of sensitizers is possible, however, the materials selected as sensitizers in this study, notably, NOCl, diethylether, trichloroethane and trichloroethylene were extremely poor. However, it has been observed that the sensitizer $SF_6$ gives a much higher yield than other senitizers or when used with other systems normally not requiring a sensitizer at all. For example, 5 torr $SF_6$, 200 torr $GeH_4$, and an irradiation time of about 5 seconds at an output power of about 50 watts/cm$^2$ gives percent conversions which are 8% higher than those observed without $SF_6$ present. Alkylgermanes with proper adjustment of concentrations of $SF_6$ and the particular torr pressure for the alkylgermane selected also gives higher yields of the desired products.

Studies of the decomposition of germane by a thermal shock tube study have been reported [13] (See Table 9). Also the kinetics of germane decomposition have been studied in detail for the thermal process [14–17] (See Table 9). The thermal decomposition of germane is quite interesting, as the rate of decomposition is affected by the presence of a germanium deposit on the walls. It would be of scientific interest to compare the laser photochemical results obtained for the decomposition of germane to the previously mentioned studies and to the UV-laser decomposition of germane Andreatta et al, Appl. Phys. Lett., 40(2), 183 (1982). It is concluded in these studies [13–18] that the decomposition occurs by the two step mechanism:

$GeH_4 \rightarrow GeH_2 + H_2$
$GeH_2 \rightarrow Ge + H_2$

This is without question the same mechanism followed in the $CO_2$ laser photochemical decomposition of germane.

Germane as a high purity source of germanium is quite expensive, $900/100 g. If another source, such as the alkylgermanes, which are less expensive could be used as a practical source of germanium, considerable cost savings could be experienced. It is recommended that the ethylgermanes be investigated in greater detail for optimal conditions and potential cost savings. The kinetics and mechanisms of the decomposition of the ethylgermanes has not been investigated. However, methylgermane has been studied thermally [18] (See Table 9). In that study, it was concluded that there were three primary routes for the homogeneous gas-phase decomposition of methylgermane:

1. $CH_3GeH_3 \rightarrow CH_3GeH + H_2$
2. $CH_3GeH_3 \rightarrow CH_4 + GeH_2$
3. $CH_3GeH_3 \rightarrow CH_2=GeH_2 + H_2$ This suggests that ethylgermane, for one example, could in an analogous manner undergo the following primary processes:

1. $CH_3CH_2GeH_3 \rightarrow CH_3CH_2GeH + H_2$
2. $CH_3CH_2GeH_3 \rightarrow CH_3CH_3 + GeH_2$
3. $CH_3CH_2GeH_3 \rightarrow CH_3CH=GeH_2 + H_2$ However, the possibility of formation of the product in #3 seems unlikely, and certainly no product of this nature was observed in the spectra of the products resulting from the irradiations of any of the ethylgermanes. However, it may be formed and then immediately decomposed in a secondary process. It would be of scientific interest and possible cost savings to investigate the mechanisms of the ethylgermane kinetics, as the ethyl group may eliminate differently than the methyl group, in fact this is frequently the case.

Table 9: Frequencies and Assignments for the Infrared Bands Observed in Thermal and Laser Photochemical Dissociations 1. H. W. Kattenberg, W. Gabes and A. Oskam, J. of Mol. Spectrosc., 44, 425 (1972).
2. D. C. McKean and A. A. Chalmirs, Spectrochim. Acta, 23A, 777 (1967).
3. A. M. W. Bakke, J. Mol. Spectrosc., 41. 1 (1972).
4. J. R. Durig and S. E. Brown, J. Mol. Spectrosc., 45, 3338 (1973).
5. R. J. O'Brien and G. A. Ozin, J. Chem. Soc., A, 1136 (1971).
6. K. M. MacKay and R. Watt, Spectrochim, Acta, 23A, 2761 (1967).
7. J. R. Durig, A. D. Lopata, and P. Groner, J. Chem. Phys., 66, 1888 (1977).
8. Herzberg, G., Infrared and Raman Spectra, (Van Nostrand Reinhold, New York, 1945), First Edition.
9. R. G. Snyder and G. Zerbi, Spectrochim, Acta, 23A, 391 (1967).
10. G. Herzberg, the Spectra of Diatomic Molecules, (Van Nostrand Reinhkold, New York, 1935), First Edition.
11. S. Pinchas, Anal. Chem., 27, 2 (1955).
12. E. R. Lippincott and M. C. Tobin, J. Am. Chem. Soc., 75, 4141 (1953).
13. Newman et al, Int. J. of Chem. Kinetics, 12, 661 (1980).
14. T. R. Haynes and W. C. Johnson, J. Am. Chem. Soc., 54, 3583 (1932).
15. K. Tamaru, M. Boudart and H. Taylor, J. Phys. Chem., 59, 1806 (1955).
16. G. G. Kevytzkh and I. A. Frolov, Russ. J. Inorg. Chem., 11, 385 (1966).
17. L. Hall, J. Electrochem. Soc., 119, 1593 (1973).
18. J. Dzarnoski, H. E. O'Neal and M. A. Ring, J. Am. Chem. Soc., 103. 5740 (1981).

We claim:

1. A method for infrared laser-induced chemical vapor deposition of polycrystalline germanium and doped-germanium films wherein in said method as said deposition increases in amount the rate of said deposition does not decrease because of the transparency of said deposited polycrystalline germanium or doped-germanium films to the output frequencies of the infrared laser inducing said deposition, said method comprising:

i. placing a prepared substrate into one or more laser reaction cells;

ii. filling one or more laser reaction cells with one or more compounds selected from germane, ethylgermane, diethylgermane, triethylgermane, tetramethylgermane, dimethylcadmium, and trimethylaluminum to a predetermined pressure from about 3.5 to about 220 torr;

iii. irradiating said compound with infrared laser radiation in the range of 10.4 or 9.4 micrometer as provided by a continuous-wave $CO_2$ laser whose single-line operation is varied in output powers between 10 and 150 watts/cm$^2$;

iv. continuing said irradiating for a predetermined time period from about 15 seconds to about one minute to effect laser photochemical dissociation of said compound contained in said laser reaction cell; and, v. repeating said irradiating for an additional predetermined time period from about 15 seconds to about one minute as required to achieve said infrared laser-induced chemical vapor deposition of polycrystalline germanium or doped-germanium films.

2. The method of claim 1 wherein said compound irradiated in said laser reaction cell is germane, said predetermined pressure is about 200 torr, said output power is about 100 watts/cm$^2$, said irradiation time is for about 30 seconds, said irradiating is by the P(30) of (00°1)-(10°0), 935 cm$^{-1}$, and wherein said film deposited on said substrate as determined with anlysis by electron scanning microscope in the x-ray mode is 100% germanium.

3. The method of claim 1 wherein said compound irradiated in said laser reaction cell is about 80 torr, said output power is about 100 watts/cm$^2$, said irradiation time is for about 30 seconds, said irradiating is by the R(26) of (00°1)-(10°0), 980 cm$^{-1}$, and wherein said film deposited on said substrate as determined with anlysis by electron scanning microscope in the x-ray mode is germanium and hydrogen.

4. The method of claim 1 wherein said compound irradiated in said laser reaction cell is diethylgermane, said predetermined pressure is about 40 torr, said output power is about 100 watts/cm$^2$, said irradiation time is for about 15 seconds, said irradiating is by the R(14) of (00°1)-(10°0), 1075 cm$^{-1}$, and wherein said film deposited on said substrate as determined with anlysis by electron scanning microscope in the x-ray mode is 100% germanium.

5. The method of claim 1 wherein said compound irradiated in said laser reaction cell is triethygermane, said predetermined pressure is about 3.5 torr, said output power is about 100 watts/cm$^2$, said irradiation time is for about 15 seconds, said irradiating is by the R(14) of (00°1)-(02°0), 1075 cm$^{-1}$, and wherein said laser-induced polycrystalline germanium is deposited on said substrate.

6. The method of claim 1 wherein said compound irradiated in said laser reaction cell is diethylgermane in mixture with diethyl ether, said predetermined pressure is about 130 torr, said output power is about 35 watts/cm$^2$, and said irradiation time is for about 30 seconds, for a first irradiation, a repeat irradiation is at a power of about 65 watts/cm$^2$ and a repeat irradiation time is for about 30 seconds, a second repeat irradiation is at a power of about 50 watts/cm$^2$ and a second repeat irradiation time is about 30 seconds, said irradiating is by the P(34) of (00°1)-(10°0), 93 cm$^{-1}$, and wherein said diethyl ether functions as a sensitizer to effectively transfer absorbed energy to said diethylgermane to effect dissociation thereof to yield germanium as identified by its infrared frequencies.

7. The method of claim 1 wherein said compound irradiated in said laser reaction cell is triethylgermane in mixture with diethyl ether, said predetermined pressure is about 20 torr, said output power is about 100 watts/cm$^2$, and said irradiation time is for about 15 seconds, for a first irradiation, a repeat irradiation is at a power of about 65 watts/cm$^2$ and a repeat irradiation time is for about 30 seconds, a second repeat irradiation is at a power of about 50 watts/cm$^2$ and a second repeat irradiation time is about 30 seconds, said irradiating is by the R(14) of (00°1)-(02°0), 1075 cm$^{-1}$, and wherein said diethyl ether functions as a sensitizer to effectively transfer absorbed energy to said triethylgermane to effect dissociation thereof to yield germanium as identified by its infrared frequencies.

8. The method of claim 1 wherein said compound irradiated in said laser reaction cell is tetraethylgermane in said mixture with NOCl, said predetermined pressure is about 70 torr each, said output power is about 75 watts/cm$^2$, and said irradiation time is for about 30 seconds, said irradiating is by the P(34) of (00°1)-(10°0), 931 cm$^{-1}$, and wherein said NOCl functions as a sensitizer to effectively transfer absorbed energy to said tetraethylgermane to effect dissociation thereof to yield germanium as identified by its infrared frequency.

9. The method of claim 1 wherein two of said compounds are irradiated in said laser reaction cell, namely: dimethylcadmium and germane, to achieve a codeposit of cadmium and germanium on said substrate, said predetermined pressure of said dimethylcadmium being about 25 torr and said predetermined pressure of germane being about 75 torr, said output power is about 100 watts/cm$^2$, said irradiation time is for about 30 seconds, said irradiating is by the P(26) of (00°1)-(10°0), 939 cm$^{-1}$, and wherein said film is a doped-ermanium film deposited on said substrate, and as determined with analysis by electron scanning microscope in the x-ray mode, is about 73% germanium and about 27% cadmium.

10. The method of claim 1 wherein two compunds are irradiated in said laser reaction cell namely: trimethylaluminum and germane, to achieve a codeposit of aluminum and germanium on said substrate, said predetermined pressure of said trimethylaluminum being about 12.5 torr and said predetermined pressure of germane being about 112 torr, said output power is about 100 watts/cm$^2$, said irradiation time is for about 30 seconds, said irradiating is by the P(26) of 11. A method for infrared laser-induced chemical vapor deposition of polycrystalline germanium and doped-germanium films wherein in said method as said deposition increases in amount the rate of said deposition does not decrease because of the transparency of said deposited polycrystalline germanium or doped-germanium films to the output frequencies of the infrared laser inducing said deposition, said method comprising:

i. placing a prepared substrate into one or more laser reaction cells;

ii. filling one or more laser reaction cells with a sensitizer of $SF_6$ to a predetermined pressure from about 5 to about 20 torr and with one or more compounds selected from germane, ethylgermane, diethylgermane, triethylgermane, tetramethylgermane, dimethylcadmium, and trimethylaluminum to a predetermined pressure from about 3.5 to about 220 torr;

iii. irradiating said one or more compounds in mixture with said sensitizer with infrared laser radiation in the range of 10.4 or 9.4 micrometer as provided by a continuous-wave $CO_2$ laser whose single-line operation is varied in output powers between 10 and 150 watts/cm$^2$;

iv. continuing said irradiating for a predetermined time period from about 5 seconds to about one minute to effect laser photochemical dissociation of said compound wherein said sensitizer of $SF_6$ effectively transfers absorbed energy to said one or more compounds contained in said laser reaction cell to effect dissociation of said one or more compounds to yield germanium or doped-germanium; and, v. repeating said irradiating for an additional predetermined time period from about 5 seconds to about one minute as required to achieve said infrared laser-induced chemical vapor deposition of polycrystalline germanium or doped-germanium films.

12. The method of claim 11 wherein said compound irradiated in said laser reaction cell is germane in mixture with $SF_6$, said predetermined pressure is about 200 torr for said germane with a predetermined pressure of about 5 torr for said $SF_6$, said output power is about 50 watts/cm$^2$, and said irradiation time is for about 5 seconds, and wherein said $SF_6$ functions as a sensitizer to effectively transfer absorbed energy to said germane to effect dissociation thereof to yield germanium as identified by its infrared frequencies.

* * * * *